(12) United States Patent
Becker et al.

(10) Patent No.: US 9,444,469 B2
(45) Date of Patent: Sep. 13, 2016

(54) LOCKED-LOOP QUIESCENCE APPARATUS, SYSTEMS, AND METHODS

(71) Applicant: Micron Technology, Inc., Boise, ID (US)

(72) Inventors: Eric Becker, Boise, ID (US); Brandon Roth, Boise, ID (US); Scott Schafer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/305,953

(22) Filed: Jun. 16, 2014

(65) Prior Publication Data

US 2014/0292389 A1    Oct. 2, 2014

Related U.S. Application Data

(63) Continuation of application No. 12/141,809, filed on Jun. 18, 2008, now Pat. No. 8,754,683.

(51) Int. Cl.
| | |
|---|---|
| *H03L 7/06* | (2006.01) |
| *H03L 7/081* | (2006.01) |
| *H03L 7/087* | (2006.01) |
| *H03L 7/091* | (2006.01) |
| *H03L 7/095* | (2006.01) |
| *G11C 11/4063* | (2006.01) |

(52) U.S. Cl.
CPC ......... *H03L 7/0814* (2013.01); *G11C 11/4063* (2013.01); *H03L 7/087* (2013.01); *H03L 7/091* (2013.01); *H03L 7/095* (2013.01)

(58) Field of Classification Search
CPC ................. H03L 7/0814; H03L 7/087; H01L 2224/48227; H01L 2224/73265
See application file for complete search history.

(56) References Cited

U.S. PATENT DOCUMENTS

| | | | |
|---|---|---|---|
| 4,565,977 A * | 1/1986 | Davenport | ................ 331/113 R |
| 6,433,359 B1 * | 8/2002 | Kelley et al. | .................. 257/40 |
| 6,433,597 B2 * | 8/2002 | Jung | ............................. 327/158 |
| 6,621,496 B1 * | 9/2003 | Ryan | ............................. 345/533 |
| 6,988,218 B2 * | 1/2006 | Drexler | ........................ 713/600 |
| 7,276,977 B2 * | 10/2007 | Self | ................................. 331/11 |
| 7,285,997 B2 * | 10/2007 | Haerle et al. | ................ 327/158 |
| 8,090,335 B1 | 1/2012 | Bataineh | |
| 8,208,596 B2 | 6/2012 | Chatwin | |
| 8,754,683 B2 | 6/2014 | Becker et al. | |
| 2005/0111560 A1 * | 5/2005 | Haines | ......................... 375/257 |
| 2007/0035348 A1 * | 2/2007 | Self | ................................. 331/16 |
| 2008/0100356 A1 * | 5/2008 | Lee | ............................... 327/158 |
| 2009/0016124 A1 * | 1/2009 | Kim | ............................. 365/194 |
| 2009/0091362 A1 * | 4/2009 | Pellerano | .............. H03L 7/0812 327/158 |
| 2009/0315600 A1 | 12/2009 | Becker et al. | |

* cited by examiner

*Primary Examiner* — Sibin Chen
(74) *Attorney, Agent, or Firm* — Schwegman Lundberg & Woessner, P.A.

(57) ABSTRACT

Apparatus, systems, and methods disclosed herein may initialize a delay-locked loop (DLL) or phase-locked loop (PLL) to achieve a locked condition and may then initiate a quiescent mode of operation. Quiescent operation may be achieved by breaking a feedback loop associated with the DLL or PLL to prevent updates to a variable delay line associated with the DLL and/or to a variable frequency oscillator associated with the PLL. An output clock phase associated with the DLL or PLL may thus be held substantially constant following a DLL initialization period. Additional embodiments are disclosed and claimed.

16 Claims, 4 Drawing Sheets

| PH1 | PH2 | |
|---|---|---|
| 0 | 0 | - Shift right |
| 0 | 1 | - Shift left (180 degrees) |
| 1 | 0 | - Phase equal |
| 1 | 1 | - Shift left |

LOCKED-LOOP QUIESCENCE APPARATUS, SYSTEMS, AND METHODS

PRIORITY APPLICATION

This application is a continuation of U.S. application Ser. No. 12/141,809, filed Jun. 18, 2008, which is incorporated herein by reference in its entirety.

TECHNICAL FIELD

Various embodiments described herein relate to apparatus, systems, and methods associated with digital clocking and synchronization, including delay-locked loops and phase-locked loops.

BACKGROUND INFORMATION

Synchronous dynamic random-access memory (SDRAM) chips, including various generations of double data rate (DDR) SDRAMs, use one or more clocks to strobe data onto and off of the memory chip. Data and strobe timing signals are often synchronized to avoid ambiguities in the data bits. As SDRAM bandwidths increase, differential signal propagation delays across the dice may cause a loss of synchronization between data bits and associated clocks.

Modern SDRAM may include one or more on-chip delay-locked loop (DLL) circuits to mitigate the differential delays. DLL-derived strobe circuits may be used to synchronize various SDRAM signals, including an output strobe with data appearing on the output lines. A DLL may delay a clock edge arriving from a distant node by a selected amount. The delayed DLL output is often used to synchronize data and clocks within SDRAM and other memory devices, including data and clocks appearing at the SDRAM output.

DETAILED DESCRIPTION

Figure 1:
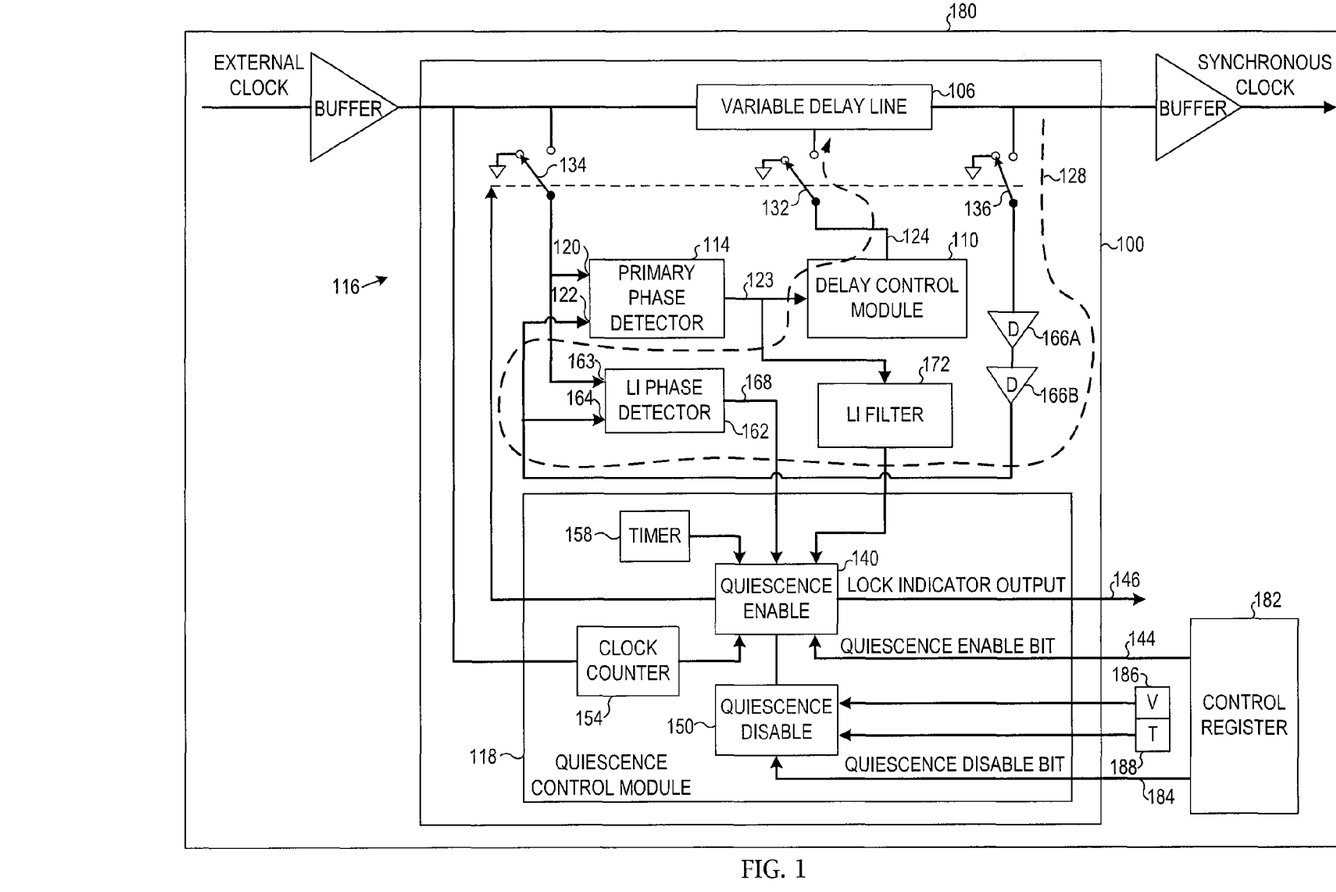
FIG. 1 is a block diagram of an apparatus and a system according to various example embodiments of the invention.

FIG. 1 is a block diagram of an apparatus 100 and a system 180 according to various embodiments of the invention. Often the incoming clock (sometimes referred to as the reference clock) associated with a DLL or a phase-locked loop (PLL) substantially meets minimum stability requirements of a circuit driven by the DLL or PLL output clock. In the latter case the DLL or PLL may be included in the circuit largely to perform a clock phase shifting function.

Embodiments herein quiesce a DLL or PLL such as to maintain a steady state in a variable delay line associated with the DLL or a variable frequency oscillator (VFO) associated with the PLL. Some embodiments may perform quiescence operations after a lock is achieved and surrounding circuitry is synchronized. Power consumption may be reduced thereby. Quiescent-mode operation may also be used in system testing to reduce timing variables caused by closed-loop operation of the DLL or PLL. In some embodiments the apparatus 100 may function as a low-power duty cycle corrector (DCC).

Although example embodiments may be described herein in terms of a DLL, this disclosure applies equally to PLL embodiments. Some example embodiments disclosed herein may refer to DDR memory, including DDR2, DDR3, or any synchronous or asynchronous memory types. However, embodiments disclosed herein are not limited to use with memories and may be included in other types of digital and hybrid integrated circuits.

The apparatus 100 includes a phase or frequency control element such as a variable delay line 106 in the DLL case. The apparatus 100 may also include a delay control module 110 coupled to the variable delay line 106. The delay control module 110 selects an amount of delay to be provided by the variable delay line 106. The apparatus 100 further includes a primary phase detector 114 coupled to the delay control module 110.

Figures 2A, 2B:
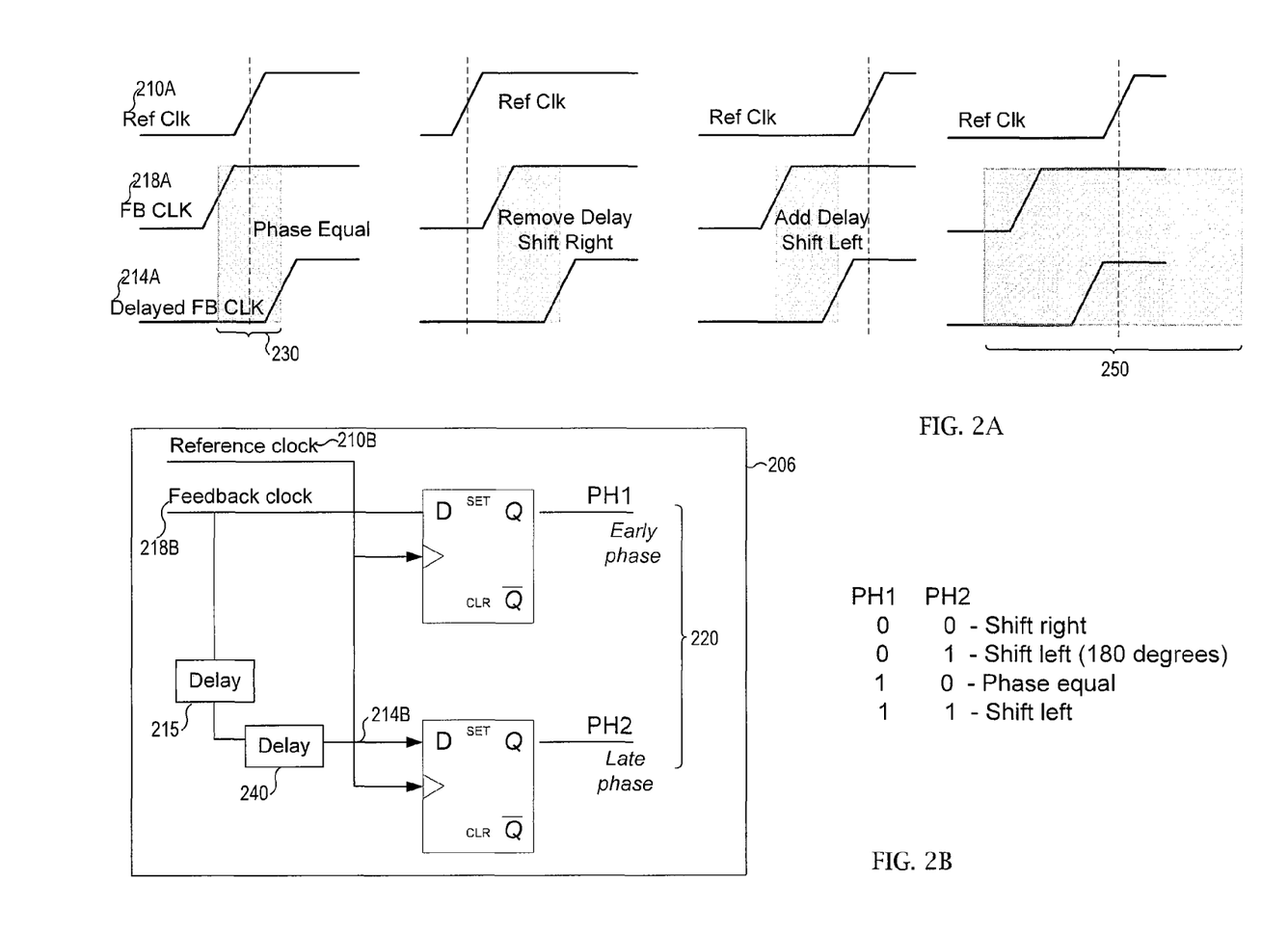
FIG. 2A is a series of clock phase diagrams showing clocking relationships according to various example embodiments.
FIG. 2B is a phase detector internal circuit showing clocking relationships according to various example embodiments.

FIGS. 2A and 2B are a series of clock phase diagrams and a phase detector internal circuit 206, respectively, showing clocking relationships according to various example embodiments. Referring to FIG. 1 in view of FIG. 2, the phase detector internal circuit 206 compares an edge position associated with a variable delay line input clock signal 210 ("Ref Clk" of FIG. 2) appearing at the input 120 of the primary phase detector 114 to an edge position associated with a delayed version 214A and 214B ("Delayed FB CLK" of FIG. 2) of a feedback clock signal 218 ("FB CLK" of FIG. 2) appearing at the input 122 of the primary phase detector 114). The delayed version 214A, 214B of the feedback clock results from a delay introduced by the delay element 215 of FIG. 2. The primary phase detector 114 provides one or more phase difference signals 220 to the delay control module 110 at the output 123.

The variable delay line 106, the delay control module 110, and the primary phase detector 114 interoperate as the DLL 116. The phase difference signals 220 may cause the delay control module 110 to select an amount of delay to be introduced by the variable delay line 106. The amount of delay may be selected such that a desired phase relationship is maintained between the variable delay line input clock signal 210A and the feedback clock appearing at the input 122 of the primary phase detector 114. The phase difference between the feedback clock signal 218A and the delayed feedback clock signal 214A is shown as the hysteresis width 230 of FIG. 2 (referred to herein sometimes as the "lock-range" hysteresis). The hysteresis width 230 is established by the delay value selected for the delay element 215.

The apparatus 100 may also include a quiescence control module 118. The quiescence control module 118 may be communicatively coupled to the undelayed clock input 120 associated with the primary phase detector 114, to the delayed clock input 122 associated with the primary phase detector 114, and/or to a delay control module output 124. The quiescence control module 118 breaks a feedback loop 128 associated with the DLL 116, such as to prevent updates to the variable delay line 106. This process results in a substantially constant amount of delay from the variable delay line 106 following the expiration of a DLL initialization period.

The apparatus 100 may further include a circuit such as switch 132 coupled to the delay control module 110 to interrupt the output of the delay control module 110 to the variable delay line 106. Alternatively or in addition to the switch 132, the apparatus 100 may include a switch 134 coupled to the primary phase detector 114 to interrupt the undelayed clock input 120. In some embodiments a switch 136 may be coupled to the primary phase detector 114 to interrupt the delayed clock input 122.

The apparatus 100 may also include a quiescence enable capability (e.g., the quiescence enable module 140 communicatively coupled to the switch 132, to the switch 134, and/or to the switch 136). The quiescence enable module 140 opens the switch 132, the switch 134, and/or the switch 136 to break the feedback loop 128 associated with the DLL 116, such as at a selected time.

The apparatus 100 may also include a quiescence enable input 144 associated with the quiescence enable module 140. The quiescence enable input 144 may receive a quiescence enable signal as a command to initiate DLL quiescence operations. The apparatus 100 may further include a lock indicator output 146 from the quiescence enable module 140. The lock indicator output 146 may provide an indication that the DLL 116 has achieved an initial lock and/or has been quiesced.

A clock counter 154 may be associated with the quiescence control module 118 and may be communicatively coupled to the quiescence enable module 140. The clock counter 154 may count clock cycles following initialization of the DLL 116 and may thus enable the quiescence control module 118 to initiate quiescence operations after a selected number of clock cycles have occurred.

The apparatus 100 may also include a timer 158 associated with the quiescence control module 118 and coupled to the quiescence enable module 140. The timer 158 may enable the quiescence control module 118 to initiate quiescence operations after a selected period of time has elapsed following initialization of the DLL 116. A quiescence disable module 150 may also be coupled to the quiescence enable module 140. The quiescence disable module 150 may disable DLL quiescent-mode operation upon command or based upon one or more conditions sensed in the operating environment.

In some embodiments, the apparatus 100 may further include a lock-indicating (LI) phase detector 162 coupled to the quiescence enable module 140. The LI phase detector 162 compares the edge position associated with the variable delay line input clock signal at the input 163 of the LI phase detector to the edge position associated with the feedback clock signal appearing at the input 164 of the LI phase detector. The LI phase detector may issue a phase equal signal at the output 168 of the LI phase detector. The phase equal signal may enable the quiescence control module to initiate quiescence operations when the LI phase detector reaches the phase-equal state.

By increasing the delay (e.g., by adding an additional delay element 240) in the delayed feedback clock path associated with the internal phase detector circuit 206 a hysteresis width 250 (shown in FIG. 2), wider than the hysteresis width 230 of the primary phase detector 114, may be selected for the LI phase detector 162. The hysteresis width 250 may be selected such that the output 168 of the LI phase detector 162 represents a phase-equal state for normal ranges of operation of the apparatus 100 following initialization. The LI phase detector 162 may thus function as a low-pass loop filter and may indicate that the DLL 116 has reached an initial locked-loop state.

Embodiments herein may utilize other initial locked-loop state indicators or a combination thereof. For example, a lock-indicating (LI) filter 172 may be coupled to the primary phase detector 114. The LI filter 172 monitors phase difference signal(s) at the output of the primary phase detector 114. The LI filter 172 may be configured to detect a selected series of transitions of the phase difference signals that are characteristic of an initial locked-loop condition. The LI filter 172 enables the quiescence control module 118 to initiate quiescence operations when the selected series of transitions of the phase difference signals indicates that the DLL 116 has achieved an initial locked state.

Additional embodiments are contemplated by the current disclosure. A system 180 may include one or more of the apparatus 100. In an example embodiment, the system 180 may include the variable delay line 106, the delay control module 110, the primary phase detector 114, the quiescence control module 118, and/or a control register 182 as components of a dynamic random-access memory (DRAM) module. The control register 182 is communicatively coupled to the quiescence control module 118 to generate a quiescence enable input 144 and/or a quiescence disable input 184 as control signals to the quiescence control module 118. In some embodiments, the control register 182 may comprise a mode register or an extended mode register according to a DDR SDRAM specification. Embodiments herein may use unassigned mode positions from the aforementioned DDR register(s). As an example, details of DDR registers associated with DDR2-compliant SRAM memories may be found in the DDR2 specification. See Joint Electron Device Engineering Council (JEDEC) Standard JESD79-2C "DDR2 SDRAM Specification," (2006).

It is noted that register control bits associated with the quiescence enable input 144 and the quiescence disable input 184 are not the same as "DLL disable" register bits that may be associated with some memories, including DDR-type DRAMs. In the latter case a DLL may be disabled such that an external (e.g., "system") clock is used to strobe output data. In contrast, using quiescence techniques described herein the apparatus 100 operates in a closed loop mode after initialization and subsequently ceases updates to the variable delay line 106, for example. Thus, for example, a fixed delay is set into the variable delay line 106 at the time that the DLL 116 reaches a locked-loop condition. The fixed delay remains in the circuit while the DLL 116 is quiesced.

The system 180 may further include a voltage sensor 186 communicatively coupled to the quiescence control module 118 to indicate a supply voltage level. Some embodiments of the system 180 may include a temperature sensor 188 coupled to the quiescence control module 118 to indicate an operating temperature level. Outputs from these example sensors and others may be used as inputs to the quiescence control module 118. The quiescence control module may take these inputs into account when deciding whether to transition the DLL 116 to or from quiescent-mode operation.

Any of the components previously described may be implemented in a number of ways, including embodiments in hardware and/or in software. Software embodiments may be used in lieu of hardware components and/or in a simulation system. The output of such a simulation system may drive the various apparatus described herein.

Thus, the apparatus 100; the variable delay line 106; the delay control module 110; the primary phase detector 114; the phase detector internal circuit 206; the clock signals 210A, 210B, 214A, 214B, 218A, 218B; the delay elements 215, 240, the phase difference signals 220; the hysteresis width 230; the DLL 116; the quiescence control module 118; the undelayed clock inputs 120, 163; the delayed clock input 122, 164; the outputs 123, 124; the feedback loop 128; the switches 132, 134, 136; the quiescence enable module 140; the quiescence enable input 144; the lock indicator output 146; the clock counter 154; the timer 158; the quiescence disable module 150; the lock-indicating (LI) phase detector 162; the hysteresis width 250; the LI phase detector output 168; the LI filter 172; the system 180; the control register 182; the quiescence disable input 184; the voltage sensor 186; and the temperature sensor 188 may all be characterized as "modules" herein.

The modules may include hardware circuitry, optical components, single or multi-processor circuits, memory circuits, software program modules and objects, firmware, and combinations thereof, as desired by the architect of the apparatus 100 and the system 180 and as appropriate for particular implementations of various embodiments.

The apparatus and systems of various embodiments may be useful in applications other than quiescent-mode clock phase control in a memory circuit. Thus, various embodiments of the invention are not to be so limited. The illustrations of the apparatus 100 and the system 180 are intended to provide a general understanding of the structure of various embodiments. They are not intended to serve as a complete description of all elements and features of apparatus and systems that can make use of the structures described herein.

The novel apparatus and systems of various embodiments may comprise or be incorporated into electronic circuitry used in computers, communication and signal processing circuitry, single-processor or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others. Some embodiments may include a number of methods.

Figure 3A:
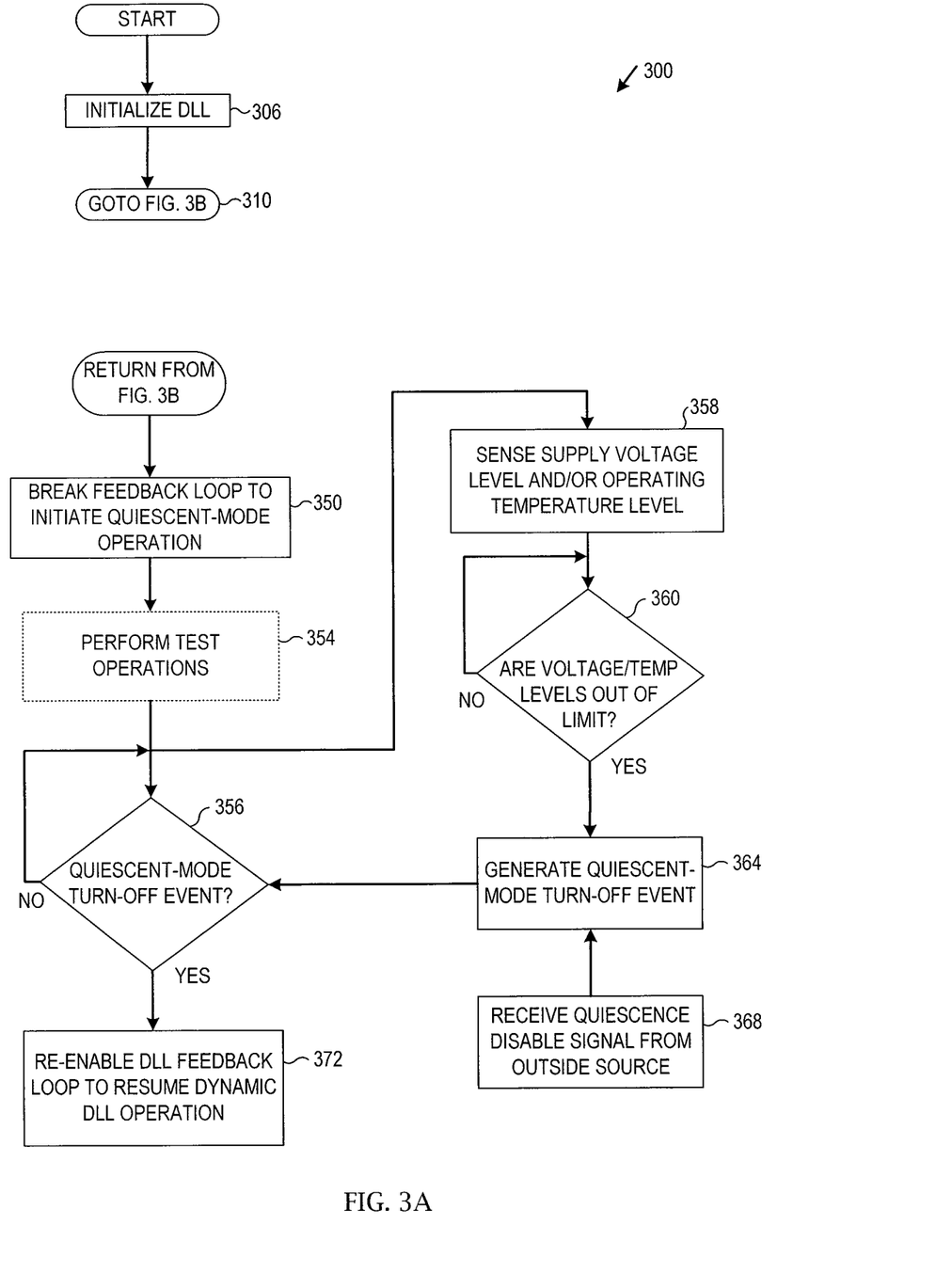
FIGS. 3A and 3B are diagrams depicting a method according to various example embodiments.
Figure 3B:
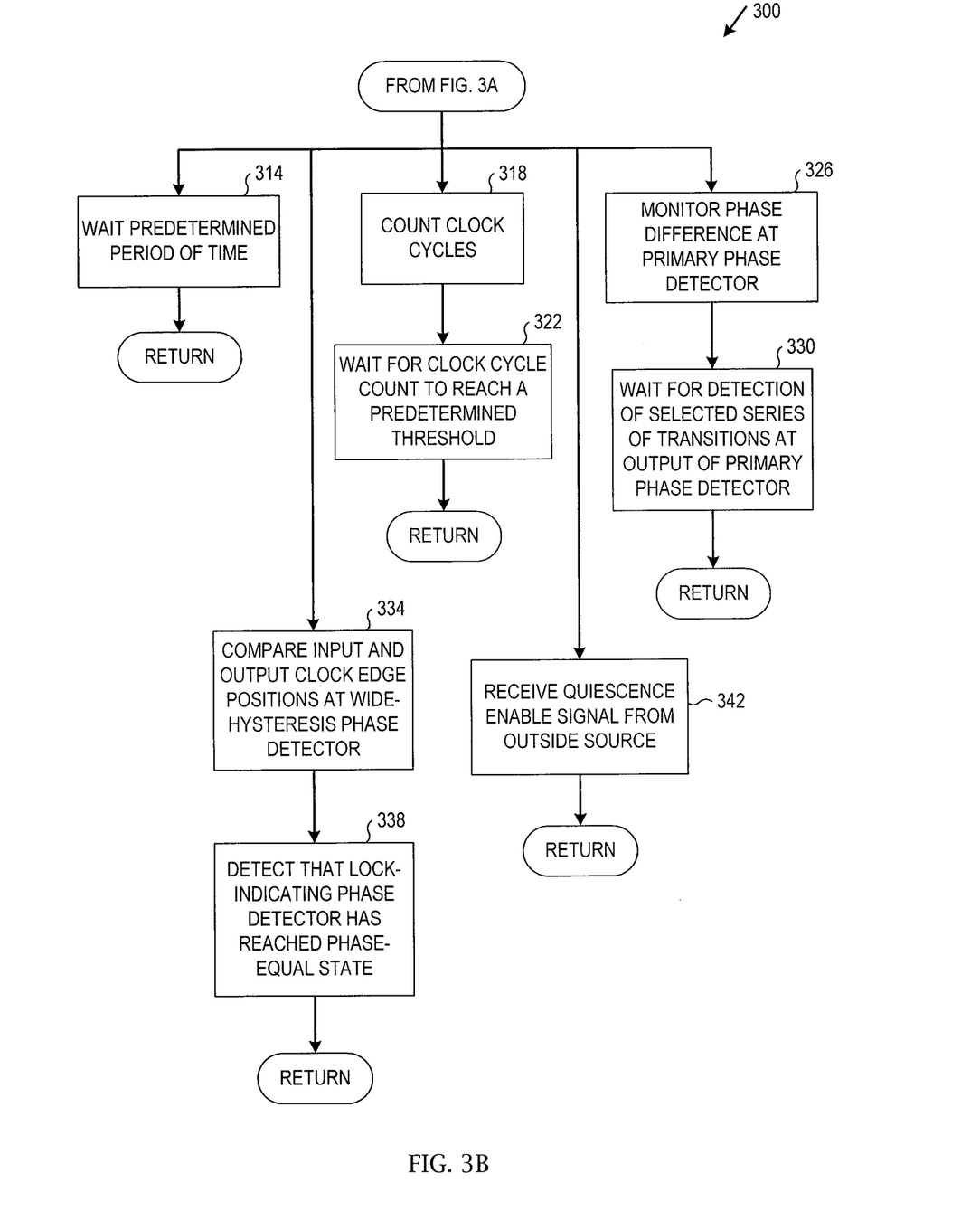

FIGS. 3A and 3B are diagrams illustrating a method 300 according to various embodiments. The method 300 may function to quiesce a DLL or a PLL after a lock is achieved such as to maintain a variable delay line associated with the DLL or a variable frequency oscillator (VFO) associated with the PLL in a steady state. In the case of a DLL operating under such quiesced conditions, for example, an amount of delay associated with the DLL may be substantially constant following the DLL initialization period. Power savings may be achieved during quiesced operating periods. Although the example method 300 may be described herein in terms of DLL operations, this disclosure applies equally to operations using a PLL.

The method 300 may commence at block 306 with initializing a DLL and may continue at block 310 branching to a number of routines located at FIG. 3B to determine whether a locked-loop condition has been achieved before initiating quiescence operations. In some embodiments, the locked-loop condition may be determined by mechanisms internal to the DLL. In some embodiments, the DLL may receive external signals or communications indicating that the locked-loop state has been reached.

Turning to FIG. 3B, some embodiments may wait a predetermined amount of time prior to initiating quiescence operations, at block 314. The predetermined amount of time may be selected to be sufficient for the DLL to achieve lock under a wide range of conditions. Alternatively, or in addition, in some embodiments the method 300 may include counting clock cycles following a start of the DLL initialization period, at block 318. In the latter case, the method 300 may include waiting for the occurrence of a selected number of clock cycles before initiating the quiescent mode of DLL operation, at block 322.

For a given circuit application, the DLL may exhibit a characteristic pattern of transitions on the phase difference outputs of the primary phase detector (e.g., the primary phase detector 114 of FIG. 1) between initialization and the point at which the DLL circuit achieves an initial locked condition. Thus, in some embodiments the method 300 may include monitoring phase difference signals at the output of the primary phase detector associated with the DLL, at block 326. In the latter case the method 300 may also include waiting for the detection of a selected series of transitions of the phase difference signals indicating that the DLL has achieved a locked state before initiating a quiescent mode of operation, at block 330.

The primary phase detector associated with the DLL may be designed with a hysteresis matched to the step size of the variable delay line (e.g., the variable delay line 106 of FIG. 1), as previously described. The hysteresis and step size should be sufficiently small to provide a resolution appropriate for the selected application. For example, a DDR output strobe clocking application may require a small variable delay line step size and a correspondingly small phase detector hysteresis.

Because of the small hysteresis mentioned above, the output of the primary phase detector may exhibit a transient behavior while acquiring an initial lock after reset. This characteristic may prevent the "phase equal" output of the primary phase detector (see FIG. 2) from operating as a reliable indicator of an initial phase locked condition. Some embodiments may therefore include a wide-hysteresis lock-indicating phase detector (e.g., the wide-hysteresis LI phase detector 162 of FIG. 1) for this purpose.

The method 300 may thus include comparing an edge position associated with a variable delay line input clock signal appearing at an undelayed input to the LI phase detector to an edge position associated with a feedback clock line output clock signal at a wide-hysteresis LI phase detector, at block 334. Turning back to FIGS. 1, 2A, and 2B, by increasing the delay (e.g., by adding an additional delay element 240) in the delayed feedback clock path associated with the internal phase detector circuit 206, a hysteresis width 250 (shown in FIG. 2), wider than the hysteresis width 230 of the primary phase detector 114, may be selected for the LI phase detector 162. The hysteresis width 250 may be selected such that the output 168 of the LI phase detector 162 represents a phase-equal state for normal ranges of operation of the apparatus 100 following initialization. The method 300 may also include detecting that the lock-indicating phase detector output has reached a phase-equal state before enabling the quiescent mode of DLL operation, at block 338.

In an alternate embodiment the method 300 may include receiving a quiescence enable signal from a source external to the DLL, at block 342. Thus, various embodiments may include one or more activities associated with determining that a phase-locked condition has been reached.

Turning back to FIG. 3A, the method 300 may subsequently include initiating a quiescent mode of DLL operation by breaking a feedback loop associated with the DLL, at block 350. Doing so can prevent updates to the variable delay line such that an amount of delay associated with the DLL is substantially constant following the initialization period. The DLL feedback loop may be broken by opening one or more of a circuit associated with the undelayed clock input to the primary phase detector (e.g., the input 120 of FIG. 1), a circuit associated with a delayed clock input to the primary phase detector (e.g., the input 122 of FIG. 1), or a circuit associated with an output of the delay control module (e.g., the output 124 of FIG. 1).

Quiescent-mode operation of the DLL may be enabled to conserve power, as previously mentioned. Additional benefits may be realized during quiescent-mode operation. In one example the method 300 may include performing test operations on a circuit sharing a die substrate with the DLL while the DLL is quiesced, at block 354. The test operations may include a latency and data latch enable circuit calibration operation or an on-die termination (ODT) timing operation associated with an SDRAM, among others. Such test operations may benefit from maintaining a static delay in the DLL variable delay line circuit in order to reduce the number of variables contributing to strobe positioning during test.

In some applications implemented in on-die circuitry including a quiesceable DLL (e.g., a DDR-type SDRAM), on-chip conditions may change while operating in quiescent mode such that continued open-loop operation could result in data errors caused by out-of-specification clocks. The method 300 may thus include monitoring for a quiescence-mode turn-off event, at block 356.

The method 300 may also include sensing a supply voltage level and/or an operating temperature level at the quiescence control module, at block 358. The method 300 may further include determining whether the supply voltage and/or an operating temperature levels have reached or exceeded a threshold beyond which open-loop, quiescence-mode operation could cause data errors, at block 360. In that case a dynamic, closed-loop mode of DLL operation is desired; so the method 300 may include generating a quiescence-mode turn-off event, at block 364.

Alternatively, the method 300 may include receiving a quiescence disable signal from a source exterior to the DLL, at block 368. The method 300 may terminate at block 372 with discontinuing the quiescent mode of DLL operation and resuming a dynamic, closed-loop mode of DLL operation when a predetermined turn-off event is sensed.

It is noted that the activities described herein may be executed in an order other than the order described. The various activities described with respect to the methods identified herein may also be executed in repetitive, serial, and/or parallel fashion.

One or more software programs may be launched from a computer-readable medium in a computer-based system to implement and perform methods disclosed herein. Various programming languages may be employed to create the software programs. The programs may be structured in an object-oriented format using an object-oriented language such as Java or C++. Alternatively, the programs may be structured in a procedure-oriented format using a procedural language, such as assembly or C. Software components may communicate using well-known mechanisms, including application program interfaces, inter-process communication techniques, and remote procedure calls, among others. The teachings of various embodiments are not limited to any particular programming language or environment.

The apparatus, systems, and methods described herein may operate to quiesce a PLL or DLL after a lock is achieved such as to maintain the frequency controlling element or the phase-controlling element of such system in a steady state. Power savings may be achieved thereby and certain testing methods may be facilitated.

By way of illustration and not of limitation, the accompanying figures show specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense.

Such embodiments of the inventive subject matter may be referred to herein individually or collectively by the term "invention" merely for convenience and without intending to voluntarily limit this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon studying the above description.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment

What is claimed is:

1. An apparatus comprising:
a variable delay line;
a delay control module coupled to the variable delay line to select an amount of delay to be provided by the variable delay line;
a primary phase detector coupled to the delay control module to compare an edge position associated with a variable delay line input clock signal to an edge position associated with a delayed version of a clock signal fed back to the primary phase detector from an output of the variable delay line and to provide at least one phase difference signal to the delay control module, the phase difference signal to cause the delay control module to select the amount of delay such that a selected phase relationship is maintained between the variable delay line input clock signal and the clock signal fed back to the primary phase detector from the output of the variable delay line, the variable delay line, the delay control module, and the primary phase detector to interoperate as a delay locked loop (DLL);
a quiescence control module to break every feedback loop associated with the variable delay line in the DLL in a quiescence mode to cause the DLL to be in an open-loop operation and to prevent updates to the variable delay line in the quiescence mode; and
a lock indicator output at the quiescence enable module to provide an indication that the DLL has been quiesced and/or locked.

2. The apparatus of claim 1, wherein the quiescence control module further comprises:

a quiescence disable module to disable DLL quiescent-mode operation upon command and/or in response to a sensed condition.

3. The apparatus of claim 1, further comprising:
a clock counter associated with the quiescence control module to count clock cycles following initialization of the DLL and to enable the quiescence control module to initiate quiescence operations after a selected number of clock cycles have occurred.

4. The apparatus of claim 1, further comprising:
a timer associated with the quiescence control module to enable the quiescence control module to initiate quiescence operations after a selected period of time has elapsed following initialization of the DLL.

5. The apparatus of claim 1, wherein the DLL comprises a low-power duty cycle corrector (DCC).

6. An apparatus comprising:
a variable delay line;
a delay control module coupled to the variable delay line to select an amount of delay to be provided by the variable delay line;
a primary phase detector coupled to the delay control module to compare an edge position associated with a variable delay line input clock signal to an edge position associated with a delayed version of a clock signal fed back to the primary phase detector from an output of the variable delay line and to provide at least one phase difference signal to the delay control module, the phase difference signal to cause the delay control module to select the amount of delay such that a selected phase relationship is maintained between the variable delay line input clock signal and the clock signal fed back to the primary phase detector from the output of the variable delay line, the variable delay line, the delay control module, and the primary phase detector to interoperate as a delay locked loop (DLL);
at least one of a first circuit coupled to the delay control module to interrupt the delay control module output, a second circuit coupled to the primary phase detector to interrupt the variable delay line input clock signal, or a third circuit coupled to the primary phase detector to interrupt the clock signal fed back to the primary phase detector from the output of the variable delay line;
a quiescence control module to break every feedback loop associated with the variable delay line in the DLL in a quiescence mode to cause the DLL to be in an open-loop operation and to prevent updates to the variable delay line in the quiescence mode, wherein the quiescence control module further comprises a quiescence enable module coupled to at least one of the first circuit, the second circuit, or the third circuit to open a first switch, a second switch, or a third switch to break the feedback loop associated with the DLL, and a quiescence enable input to the quiescence enable module to receive a quiescence enable signal as a command to initiate DLL quiescence operations; and
a lock indicator output at the quiescence enable module to provide an indication that the DLL has been quiesced and/or locked.

7. An apparatus comprising:
a variable delay line;
a delay control module coupled to the variable delay line to select an amount of delay to be provided by the variable delay line;
a primary phase detector coupled to the delay control module to compare an edge position associated with a variable delay line input clock signal to an edge position associated with a delayed version of a clock signal fed back to the primary phase detector from an output of the variable delay line and to provide at least one phase difference signal to the delay control module, the phase difference signal to cause the delay control module to select the amount of delay such that a selected phase relationship is maintained between the variable delay line input clock signal and the clock signal fed back to the primary phase detector from the output of the variable delay line, the variable delay line, the delay control module, and the primary phase detector to interoperate as a delay locked loop (DLL);
a quiescence control module to break every feedback loop associated with the variable delay line in the DLL in a quiescence mode to cause the DLL to be in an open-loop operation and to prevent updates to the variable delay line in the quiescence mode; and
a lock-indicating phase detector coupled to the quiescence control module, the lock-indicating phase detector having a wider hysteresis curve than the primary phase detector, the lock-indicating phase detector to compare the edge position associated with the variable delay line input clock signal to the edge position associated with a delayed version of a clock signal fed back to the lock-indicating phase detector from an output of the variable delay line and to provide a signal to enable the quiescence control module to initiate quiescence operations at least partially in response to the lock-indicating phase detector reaching a phase-equal state.

8. An apparatus comprising:
a variable delay line;
a delay control module coupled to the variable delay line to select an amount of delay to be provided by the variable delay line;
a primary phase detector coupled to the delay control module to compare an edge position associated with a variable delay line input clock signal to an edge position associated with a delayed version of a clock signal fed back to the primary phase detector from an output of the variable delay line and to provide at least one phase difference signal to the delay control module, the phase difference signal to cause the delay control module to select the amount of delay such that a selected phase relationship is maintained between the variable delay line input clock signal and the clock signal fed back to the primary phase detector from the output of the variable delay line, the variable delay line, the delay control module, and the primary phase detector to interoperate as a delay locked loop (DLL);
a quiescence control module to break every feedback loop associated with the variable delay line in the DLL in a quiescence mode to cause the DLL to be in an open-loop operation and to prevent updates to the variable delay line in the quiescence mode; and
a lock-indicating filter coupled to the primary phase detector to monitor the phase difference signal and to enable the quiescence control module to initiate quiescence operations at least partially in response to a selected series of transitions of the phase difference signal indicating that the DLL has achieved a locked state.

9. A delay locked loop (DLL) comprising:
a variable delay line to receive an input clock signal and provide an output clock signal at an output of the variable delay line;

a phase detector to generate an output signal based on the input clock signal and a signal generated from a feedback loop coupled to the output of the of the variable delay line;

a delay control module to select an amount of delay provided by the variable delay line based on the output signal from the phase detector; and a control module to initiate a quiescence mode to cause the DLL to be in an open-loop operation and to prevent updates to the variable delay line in the quiescence mode from every feedback loop associated with the variable delay line, wherein the control module is configured to break the feedback loop based on output from a temperature sensor.

10. A delay locked loop (DLL) comprising:

a variable delay line to receive an input clock signal and provide an output clock signal;

a phase detector to generate an output signal based on the input clock signal and a signal generated based on the output clock signal;

a delay control module to select an amount of delay provided by the variable delay line based on the output signal from the phase detector; and a control module to initiate a quiescence mode to cause the DLL to be in an open-loop operation, the control module includes inputs to receive an operating temperature level from a temperature sensor to disable the quiescence mode based on operating temperature level from the temperature sensor reaching a threshold level in order to cause the DLL to be in a close-loop mode of the DLL.

11. The DLL of claim 10, wherein the control module is configured to disable the quiescence mode based on the operating temperature reaching a threshold level.

12. The DLL of claim 10, wherein the control module is configured to initiate the quiescence mode based an amount of time that has elapsed following initialization of the DLL.

13. The DLL of claim 10, wherein the control module is configured to initiate the quiescence mode based on a number of clock cycles that has occurred after initialization of the DLL.

14. A delay locked loop (DLL) comprising:

a variable delay line to receive an input clock signal and provide an output clock signal;

a phase detector to generate an output signal based on the input clock signal and a signal generated based on the output clock signal;

a delay control module to select an amount of delay provided by the variable delay line based on the output signal from the phase detector; and a control module including inputs to receive an operating temperature level from a temperature sensor to decide whether to transition the DLL to or from a quiescent-mode operation based on the operating temperature level from the temperature sensor.

15. The DLL of claim 14, wherein the control module is configured to determine whether the operating temperature level from the temperature sensor has reached a threshold beyond which quiescence-mode operation causes data errors.

16. The DLL of claim 15, wherein the control module is configured generate a quiescence-mode turn-off event if the operating temperature level from the temperature sensor has reached the threshold beyond which the quiescence-mode operation causes data errors.

* * * * *